(12) United States Patent
Dyer et al.

(10) Patent No.: US 7,452,758 B2
(45) Date of Patent: Nov. 18, 2008

(54) PROCESS FOR MAKING FINFET DEVICE WITH BODY CONTACT AND BURIED OXIDE JUNCTION ISOLATION

(75) Inventors: Thomas W. Dyer, Pleasant Valley, NY (US); Haining S. Yang, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/686,013

(22) Filed: Mar. 14, 2007

(65) Prior Publication Data

US 2008/0224213 A1    Sep. 18, 2008

(51) Int. Cl.
*H01L 21/336* (2006.01)

(52) U.S. Cl. .................... 438/149; 438/284; 438/407; 257/E21.618; 257/E21.442

(58) Field of Classification Search ....... 438/FOR. 191, 438/407, 149, 284; 257/E21.618, E21.442
See application file for complete search history.

(56) References Cited

U.S. PATENT DOCUMENTS

| | | | |
|---|---|---|---|
| 6,774,437 B2 | 8/2004 | Bryant et al. | |
| 6,885,055 B2 | 4/2005 | Lee | |
| 7,098,477 B2 * | 8/2006 | Zhu et al. | ............ 257/66 |
| 7,105,390 B2 * | 9/2006 | Brask et al. | ............ 438/149 |
| 7,163,851 B2 | 1/2007 | Abadeer et al. | |
| 2004/0217420 A1 * | 11/2004 | Yeo et al. | ............ 257/347 |
| 2005/0062088 A1 * | 3/2005 | Houston | ............ 257/296 |
| 2005/0093074 A1 * | 5/2005 | Anderson et al. | ............ 257/365 |
| 2005/0239242 A1 * | 10/2005 | Zhu et al. | ............ 438/199 |
| 2006/0091463 A1 | 5/2006 | Donze et al. | |
| 2006/0157687 A1 * | 7/2006 | Doyle et al. | ............ 257/19 |
| 2007/0001173 A1 * | 1/2007 | Brask et al. | ............ 257/67 |
| 2007/0111419 A1 * | 5/2007 | Doyle et al. | ............ 438/197 |
| 2007/0272925 A1 * | 11/2007 | Choi et al. | ............ 257/51 |

* cited by examiner

*Primary Examiner*—George Fourson
(74) *Attorney, Agent, or Firm*—Ohlandt, Greeley, Ruggiero & Perle, L.L.P.; Joseph P. Abate, Esq.

(57) ABSTRACT

There is a FinFET device. The device has a silicon substrate, an oxide layer, and a polysilicone gate. The silicon substrate defines a planar body, a medial body, and a fin. The planar body, the medial body, and the fin are integrally connected. The medial body connects the planar body and the fin. The planar body extends generally around the medial body. The fin is situated to extend substantially from a first side of the substrate to an opposing second side of the substrate. The fin is substantially perpendicularly disposed with respect to the planar body. The first oxide layer is situated on the planar body between the planar body and the fin. The oxide layer extends substantially around the medial body. The polysilicone gate is situated on the oxide layer to extend substantially from a third side to an opposing fourth side of the substrate. The gate is situated to extend across the fin proximal to a medial portion of an upper surface of the fin. There is also a process for making a FinFET device.

2 Claims, 6 Drawing Sheets

PROCESS FOR MAKING FINFET DEVICE WITH BODY CONTACT AND BURIED OXIDE JUNCTION ISOLATION

BACKGROUND OF THE INVENTION

1. Field of the Invention

The present invention relates to a FinFET device. The present invention further relates to a process for making a FinFET device.

2. Description of the Related Art

FinFET transistors are candidates for next generation CMOS technologies. Conventional FinFET devices typically have an SOI substrate, a fin, and a gate with an oxide layer between the substrate and the fin. Such conventional devices lack body connection between the substrate and the fin, which causes difficulties in controlling floating body voltage.

A FinFET device proposed in the art for addressing floating body voltage difficulties employs a body connection between the substrate and the fin along the entire length of the fin. While the floating body voltage difficulty is addressed, undesirable levels of current leakage occur in the regions of the fin outside the gate.

It would be desirable to have a FinFET device that is substantially free of floating body voltage control problems and is substantially free of current leakage.

SUMMARY OF THE INVENTION

According to the present invention, there is a FinFET device. The device has a silicon substrate, a first oxide layer, a second oxide layer, a nitride layer, and a polysilicone gate. The silicon substrate defines a planar body, a medial body, and a fin. The planar body, the medial body, and the fin are integrally connected. The medial body connects the planar body and the fin. The planar body extends generally around the medial body. The fin is situated to extend substantially from a first side of the substrate to an opposing second side of the substrate. The fin is substantially perpendicularly disposed with respect to the planar body. The fin has an upper surface. The first oxide layer is situated on the planar body between the planar body and the fin. The first oxide layer extends substantially around the medial body. The second oxide layer is situated on a medial portion of the upper surface of the fin. The nitride layer is situated on the second oxide layer. The polysilicone gate is situated on the first oxide layer to extend substantially from a third end to a fourth end of the substrate. The gate is being situated to extend across the fin, the second oxide layer, and the nitride layer proximal to the medial portion of the upper surface of the fin.

Further according to the present invention, there is a process for making a FinFET device. The process has the following steps: a) providing a silicon substrate; b) forming a first oxide layer on the substrate; c) forming a nitride layer on the first oxide layer; d) forming a first photoresist layer on the nitride layer; e) etching portions of the nitride layer and strip portions of the first photoresist layer to yield a single fin of the nitride layer and the photoresist layer extending from a first side of the substrate to an opposing second side of the substrate thereof; f) implanting oxygen into the substrate at a third side and an opposing fourth side thereof to form two parallel oxide regions extending from the first side of the substrate to the second side of the substrate with the two parallel oxide regions being separated by a separation region of the substrate that extends from the first side to the second side and is substantially free of implantation; g) etching the first photoresist layer from the nitride layer; h) annealing the substrate to bury the oxide regions within the substrate; i) etching away the portions of the substrate proximal to the third and fourth sides down to the buried oxide regions to yield a rectangular, vertically extending fin of substrate and the nitride layer; j) forming a second oxide layer on the upper surface of the fin; k) forming a conductive layer on the upper surfaces of the oxide regions and the second oxide layer wherein the conductive layer has an exposed surface; l) imprinting a lithographic pattern into the exposed surface of the conductive layer at a medial portion thereof extending from the third side to the fourth side; m) forming a second layer of photoresist on the lithographic pattern; n) etching away the portions of the conductive layer and portions of the nitride layer not covered by the second layer of photoresist; p) implanting oxygen to form an oxide the separation region at the first and second sides partly therein so as to form opposing oxide subregions and an interior subregion that is substantially free of oxide formation and is integrally connected to the remainder of the substrate; q) etching away the second layer of photoresist; and r) annealing the substrate to bury the oxide subregions within the substrate.

DETAILED DESCRIPTION OF THE INVENTION

Figure 1:
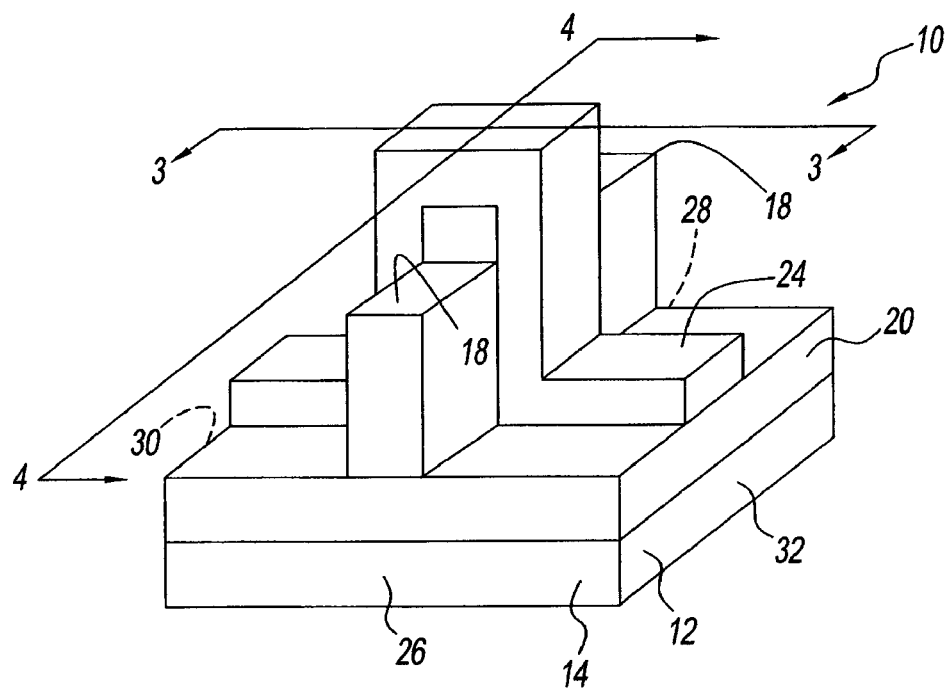
FIG. 1 shows a perspective view of a representation of a FinFET device according to the present invention.
Figure 2:
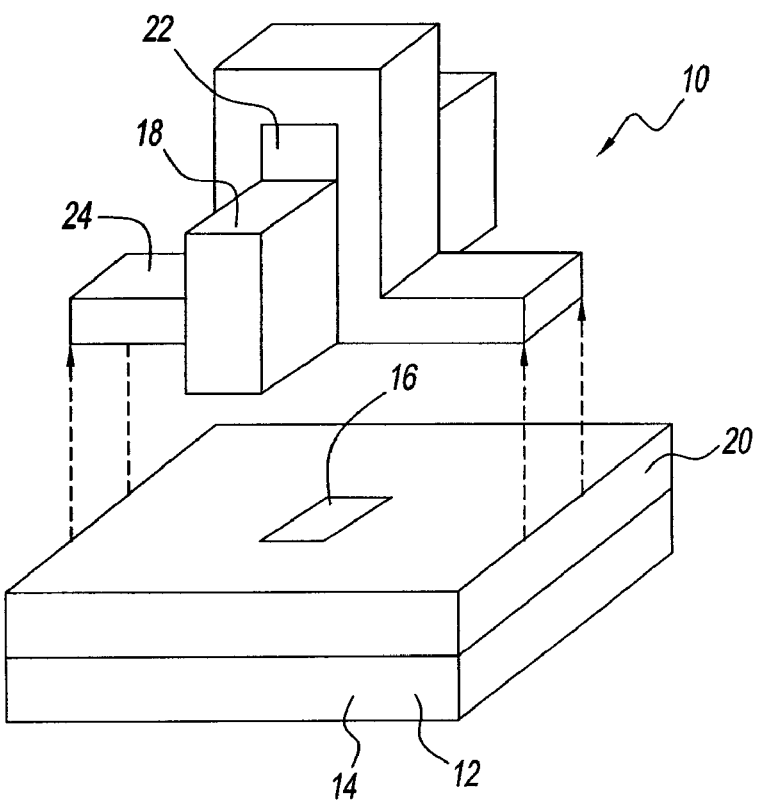
FIG. 2 shows an exploded view of the device of FIG. 1.
Figure 3:
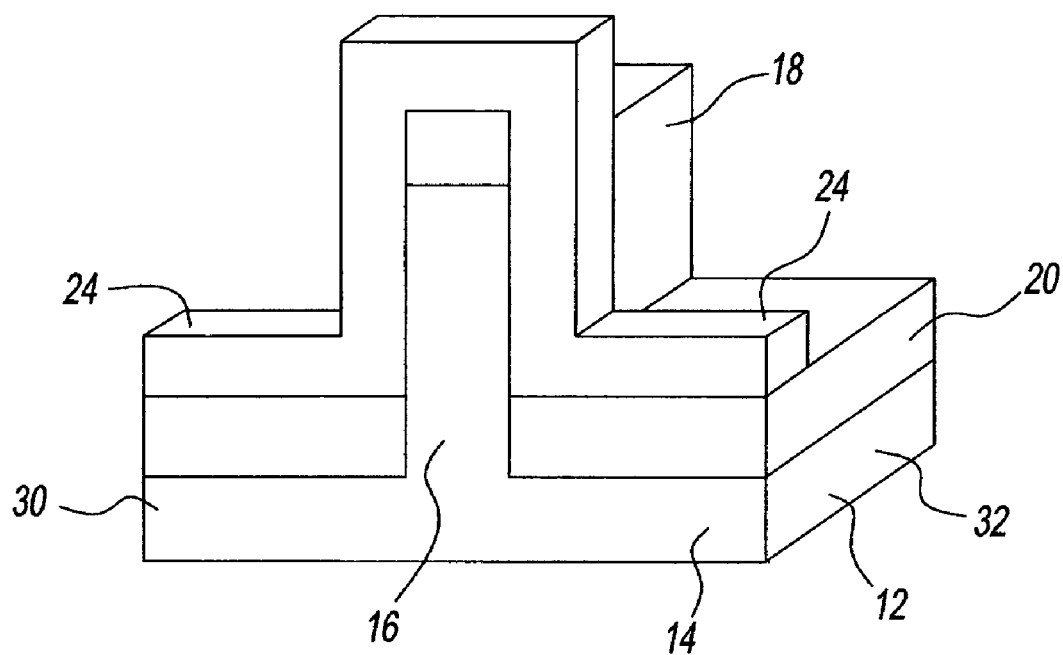
FIG. 3 shows a cross-sectional view of the device of FIG. 1 taken along a line 3-3.
Figure 4:
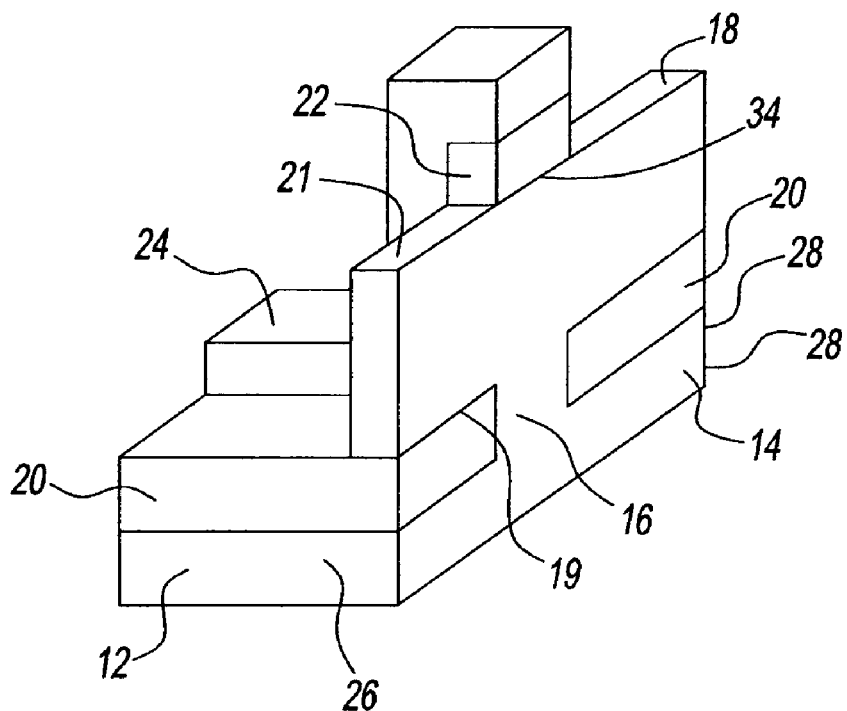
FIG. 4 shows a cross-sectional view of the device of FIG. 1 taken along a line 4-4.

The device of the present invention is substantially free of the floating body problem found in prior art FinFET devices. The device of the present invention provides body contact that is aligned with the FinFET channel region while providing for isolation between individual fins and between FinFET junctions and the substrate. This body contact can be characterized as "self-aligning" because no positioning is required between the fin, gate, and substrate. The self-aligning body contact is formed via selective oxygen implantation that is masked at the intersection of the fin and the gate.

An embodiment of the FinFET device of the present invention is shown, for example, in FIGS. 1 to 4, and is generally referenced by the numeral 10. Device 10 has a silicone substrate 12 defining a planar body 14, a medial body 16, and a fin 18. Silicone substrate 12 is unitary with planar body 14, medial body 16, and fin 18 being integrally connected. Device 10 also has a first oxide layer 20, a second oxide layer (not shown), a nitride layer 22, and a conductive gate 24. Gate 24 can be composed of any conductive material, such as a metal or polysilicone. Fin 18 extends substantially from a first side 26 of silicone substrate 12 to a second side 28. Fin 18 has a lower surface 19 and an upper surface 21. Silicone substrate 12 takes the general shape of the letter "I" or an I-beam in cross-section along line 4-4. First oxide layer 20 is situated between planar body 14 and fin 18 and around medial body 16. First oxide layer 20 is positioned to prevent body contact between planar body 14 and fin 18 except at medial body 16. Gate 24 substantially extends from a third side 30 to a fourth side 32 of substrate 12. Gate 24 is situated on/over first oxide layer 20, fin 18, nitride layer 22, and the second oxide layer (not shown). Gate 24 is positioned across and generally perpendicular to fin 18 proximal to a medial portion 34 of fin 18. Nitride layer 22 is situated between fin 18 and gate 24. Second oxide layer (not shown) is situated between nitride layer 22 and fin 18 and prevents body contact therebetween. Optionally, fin 18 has additional thin oxide layers (not shown) thereon on its surfaces contiguous to gate 24.

Figure 15:
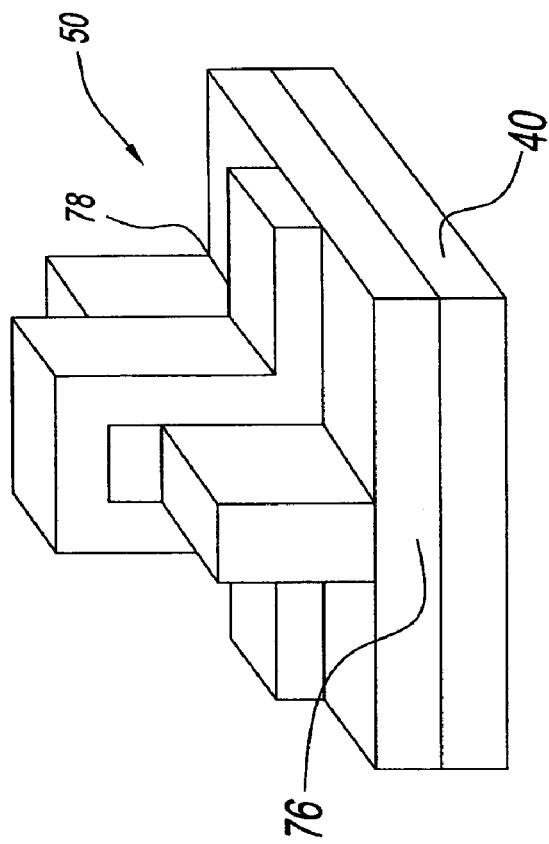
FIG. 15 shows a perspective view of a ninth step in producing a FinFET device by annealing the substrate to form buried oxide at the medial portions of the substrate.

An embodiment of a process for making a FinFET device of the present invention is disclosed herein, with the device being generally referenced by the number 38 as shown in FIG. 15. Various intermediary structures formed during the process are illustrated, for example, in FIGS. 5 to 14.

Figure 5:
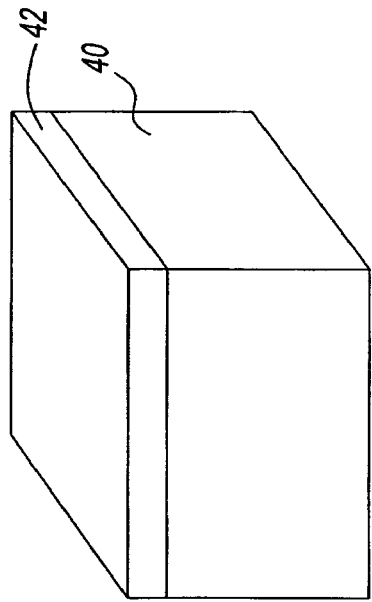
FIG. 5 shows a perspective view of a representation of a first step in producing a FinFET device according to the present invention by providing a bulk silicone substrate having a nitride layer formed thereon.
Figure 7:
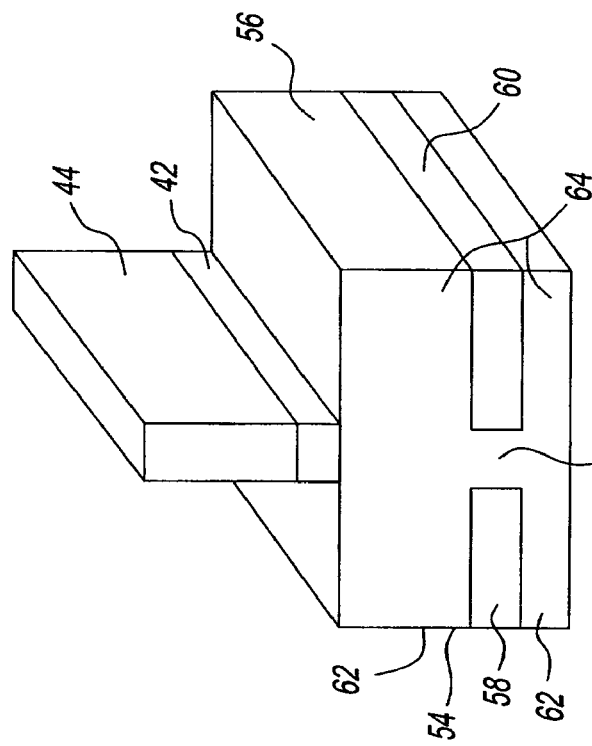
FIG. 7 shows a perspective view of a third step in producing a FinFET device by implanting oxygen into the substrate at medial portions thereof to form two parallel oxide regions.
Figure 6:
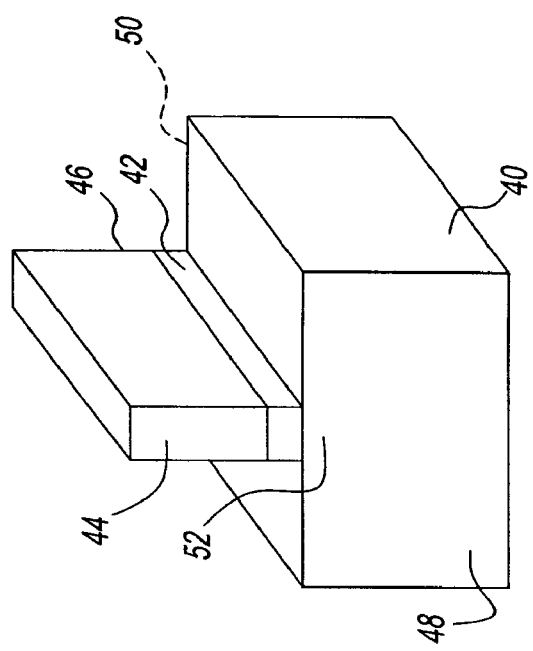
FIG. 6 shows a perspective view of a second step in producing a FinFET device by forming a nitride layer on the oxide layer, forming a layer of photoresist on the nitride layer, and etching of the nitride and photoresist layers to yield a single fin.
Figure 10:
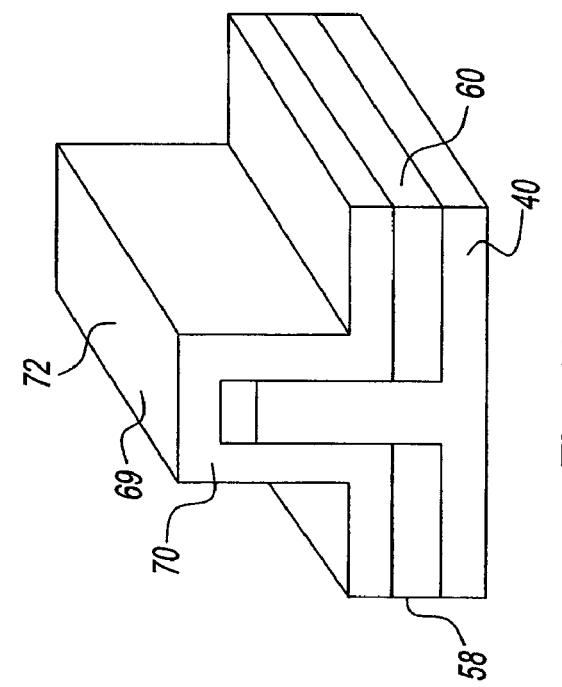
FIG. 10 shows a perspective view of a sixth step in producing a FinFET device by forming a conductive layer, e.g., a polysilicone layer, on the oxide regions and the nitride layer.
Figure 8:
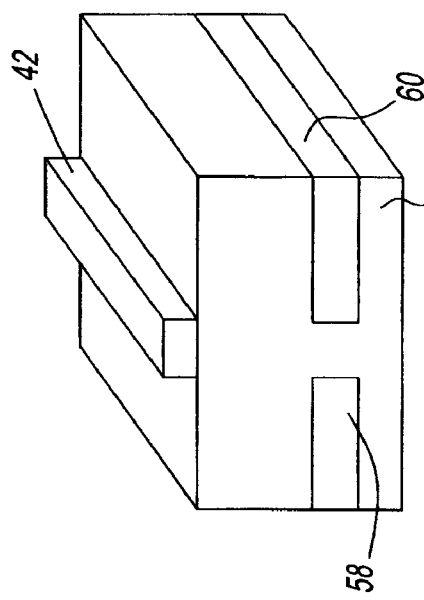
FIG. 8 shows a perspective view of a fourth step in producing a FinFET device by etching to remove the photoresist layer and annealing to bury the oxide regions.
Figure 9:
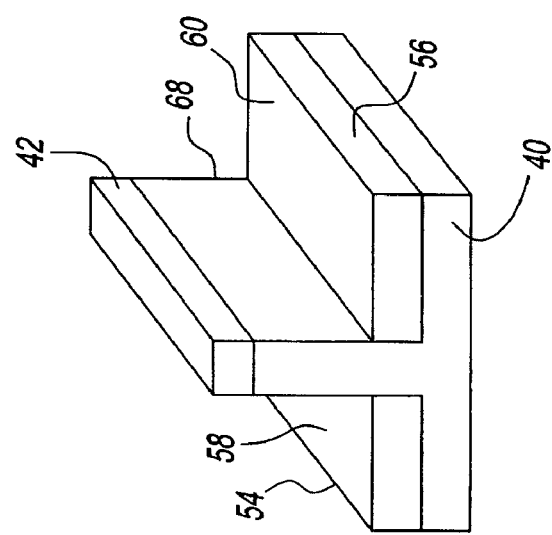
FIG. 9 shows a perspective view of a fifth step in producing a FinFET device by etching away portions of the substrate down the buried oxide regions to yield a fin of silicon and nitride.
Figure 11:
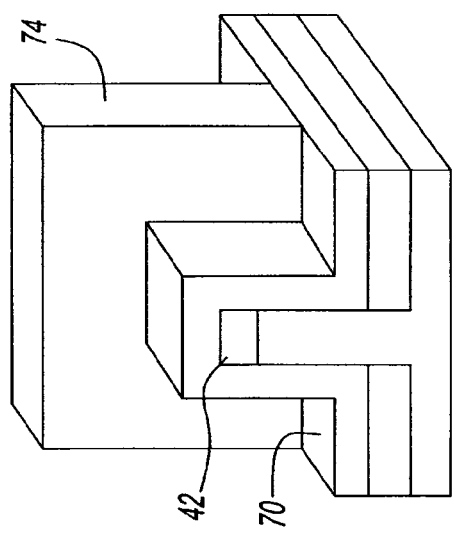
FIG. 11 shows a perspective view of a sixth step in producing a FinFET device by lithographically imprinting the polysilicone layer, forming a layer of photoresist on the lithographic pattern, and etching away portions of the polysilicone layer not covered by the photoresist layer.
Figure 12:
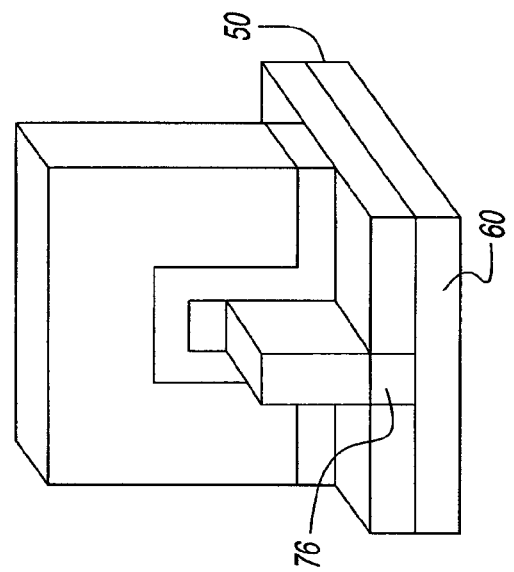
FIG. 12 shows a perspective view of a seventh step in producing a FinFET device by etching away portions of the nitride layer not covered by the photoresist layer.
Figure 13:
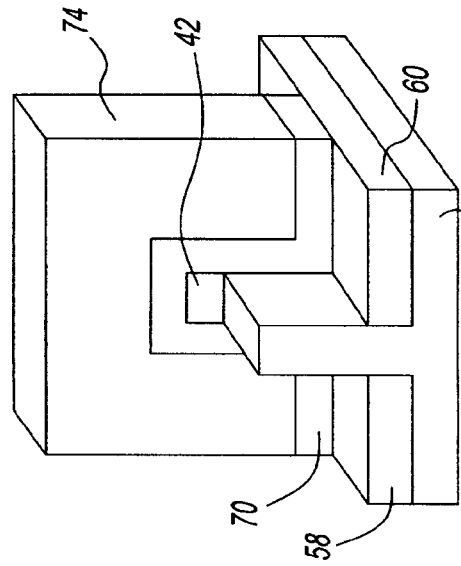
FIG. 13 shows a perspective view of a eighth step in producing a FinFET device by implanting oxygen in medial portions of the substrate between the oxide regions.
Figure 14:
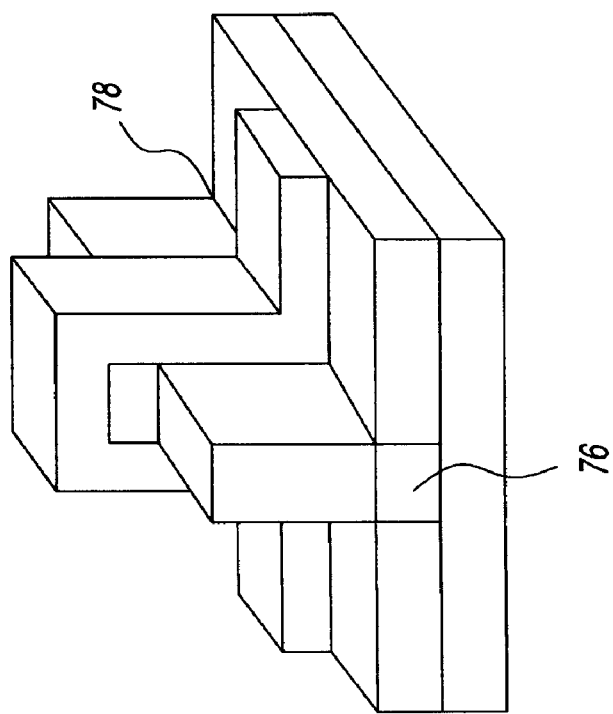
FIG. 14 shows a perspective view of a ninth step in producing a FinFET device by etching away the photoresist layer.

First, a bulk silicon substrate 40 is provided. An oxide layer (not shown) is then formed on substrate 40. A nitride layer 42 is formed on the oxide layer as shown in FIG. 5. A photoresist layer 44 is formed on nitride layer 42. Photoresist layer 44 is stripped and nitride layer 42 etched to yield a single fin 46 of nitride and photoresist as shown in FIG. 6. Fin 46 extends from a first side 48 of substrate 40 to an opposing second side 50 of substrate 40 at a medial portion 52 of substrate 40. Oxygen is implanted into substrate 40 to form oxides at side portions of substrate 40 adjacent a third side 54 and an opposing fourth side 56 to form two parallel oxide regions 58 and 60 extending from first side 48 to second side 50 as shown in FIG. 7. The portions of substrate 40 in which oxygen is injected are medial with respect to the vertical extension of substrate 40 as shown in FIG. 6 such that unreacted/unconverted portions 62 and 64 of substrate 40 remain above and below oxide regions 58 and 60. Oxide regions 58 and 60 are separated by a separation region 66 of substrate 40 that extends from first side 48 to second side 50 that remains unreacted/unconverted. Photoresist layer 44 is then stripped from nitride layer 42 in pin 46 as shown in FIG. 8. Substrate 40 is annealed to bury oxide regions 58 and 60 within substrate 60 as shown in FIG. 8. Portions of substrate 40 adjacent third and fourth sides 54 and 56 are etched down to buried oxide regions 58 and 60. The etching yields a rectangular, vertically extending fin 68 composed of substrate 40, the second oxide layer (not shown), and nitride layer 42 as shown in FIG. 9. A third oxide layer (not shown) is formed on nitride layer 42. A polysilicone layer 70 is formed on oxide regions 58 and 60 and the third oxide layer as shown in FIG. 10 and extends from third side 54 to fourth side 56. A bilayer lithographic pattern (not shown) is imprinted onto an exposed surface 69 of polysilicone layer 70 at a medial portion 72 thereof. A second photoresist layer 74 is formed on polysilicone layer 70 (and the lithographic pattern) at medial portion 72 as shown in FIG. 11. Portions of polysilicone layer 70 and nitride layer 42 not covered by second photoresist layer 74 are stripped away as shown in FIG. 12. Oxygen is implanted to form an oxide at separation region 66 of substrate 40 partially therethrough from first and second sides 48 and 50 to form opposing oxide subregions 76 and 78, respectively, as shown in FIGS. 13 and 14. The subregion of substrate 40 between subregions 76 and 78 is not subjected to implantation and, thus, left unreacted/unconverted. The unreacted/unconverted subregion corresponds to medial body 16 shown in FIGS. 1 and 3. Second photoresist layer 74 is stripped away. Substrate 40 is then annealed to bury oxide regions 76 and 78 as shown in FIG. 15.

Annealing is typically carried out at a temperature range from about 1250° C. to about 1350° C.

The present invention is useful for an applicable in both double-gate and triple-gate FinFET devices.

It should be understood that the foregoing description is only illustrative of the present invention. Various alternatives and modifications can be devised by those skilled in the art without departing from the invention. Accordingly, the present invention is intended to embrace all such alternatives, modifications and variances that fall within the scope of the appended claims.

What is claimed is:

1. A process for making a FinFET device, comprising:
   a) providing a bulk silicon substrate;
   b) forming a first oxide layer on the substrate;
   c) forming a nitride layer on the first oxide layer;
   d) forming a first photoresist layer on the nitride layer;
   e) etching portions of the nitride layer and strip portions of the first photoresist layer to yield a single fin of the nitride layer and the photoresist layer extending from a first side of the substrate to an opposing second side of the substrate thereof;
   f) implanting oxygen into the substrate at a third side and an opposing fourth side thereof to form two parallel oxide regions extending from the first side of the substrate to the second side of the substrate with the two parallel oxide regions being separated by a separation region of the substrate that extends from the first side to the second side and is substantially free of implantation;
   g) etching the first photoresist layer from the nitride layer;
   h) annealing the substrate to bury the oxide regions within the substrate;
   i) etching away the portions of the substrate proximal to the third and fourth sides down to the buried oxide regions to yield a rectangular, vertically extending fin of substrate and the nitride layer;
   j) forming a second oxide layer on the upper surface of the fin;

k) forming a conductive layer on the upper surfaces of the oxide regions and the second oxide layer wherein the conductive layer has an exposed surface;

l) imprinting a lithographic pattern into the exposed surface of the conductive layer at a medial portion thereof extending from the third side to the fourth side;

m) forming a second layer of photoresist on the lithographic pattern;

n) etching away the portions of the conductive layer and portions of the nitride layer not covered by the second layer of photoresist;

o) implanting oxygen to form an oxide the separation region at the first and second sides partly therein so as to form opposing oxide subregions and an interior subregion that is substantially free of oxide formation and is integrally connected to the remainder of the substrate;

p) etching away the second layer of photoresist; and q) annealing the substrate to bury the oxide subregions within the substrate.

2. The process of claim 1, wherein the conductive layer is a polysilicone layer.

* * * * *